United States Patent
Cheng et al.

(10) Patent No.: US 7,848,174 B2
(45) Date of Patent: Dec. 7, 2010

(54) MEMORY WORD-LINE TRACKING SCHEME

(75) Inventors: Hong-Chen Cheng, Hsinchu (TW); Hung-Jen Liao, Hsin-Chu (TW); Cheng Hung Lee, Hsinchu (TW); Ruei-Je Tsai, Tainan (TW)

(73) Assignee: Taiwan Semiconductor Manufacturing Co, Ltd., Hsin-Chu (TW)

( * ) Notice: Subject to any disclaimer, the term of this patent is extended or adjusted under 35 U.S.C. 154(b) by 265 days.

(21) Appl. No.: 12/126,780

(22) Filed: May 23, 2008

(65) Prior Publication Data

US 2009/0290446 A1  Nov. 26, 2009

(51) Int. Cl.
  *G11C 8/00* (2006.01)
  *G11C 7/00* (2006.01)
(52) U.S. Cl. ............... 365/230.06; 365/189.09; 365/210.1; 365/233.1; 365/233.14
(58) Field of Classification Search ............ 365/189.09, 365/210.1, 230.06, 233.1, 233.14
See application file for complete search history.

(56) References Cited

U.S. PATENT DOCUMENTS

| | | | | |
|---|---|---|---|---|
| 5,784,331 A | * | 7/1998 | Lysinger | 365/230.06 |
| 5,936,895 A | * | 8/1999 | Shirley | 365/230.06 |
| 5,999,480 A | * | 12/1999 | Ong et al. | 365/230.06 |
| 6,128,237 A | * | 10/2000 | Shirley et al. | 365/210.1 |
| 6,297,996 B1 | * | 10/2001 | McClure | 365/189.09 |
| 6,738,296 B2 | * | 5/2004 | Sung et al. | 365/233.14 |

* cited by examiner

*Primary Examiner*—Trong Phan
(74) *Attorney, Agent, or Firm*—K&L Gates LLP

(57) ABSTRACT

A word-line tracking system for a memory array having a plurality of memory cells, the word-line tracking system comprises a dummy row having substantially identical structure as one or more regular rows of the memory cells, the dummy row including a dummy word-line having a first and a second end at the opposite longitudinal ends of the dummy word-line, the first end being connected to a word-line driver, a self timing generator configured to receive a clock signal and generate a pulse signal in sync with the clock signal for the dummy word-line driver, the self timing generator having a first terminal for receiving a feedback signal to determine the falling edge of the pulse signal, a voltage-to-current converter connected to the second end of the dummy word-line, a current-to-voltage converter connected to the feedback terminal, and a wire connecting the voltage-to-current converter to the current-to-voltage converter.

14 Claims, 3 Drawing Sheets

FIG. 1 -- PRIOR ART --

MEMORY WORD-LINE TRACKING SCHEME

BACKGROUND

The present invention relates generally to semiconductor memory designs, and, more particularly, to a semiconductor memory internal timing design.

Semiconductor memories, such as static random access memory (SRAM) or dynamic random access memory (DRAM), have large number of memory cells arranged in arrays. A particular memory cell inside an array is typically selected by a word-line (WL) and a pair of bit-lines (BLs). The WL is typically connected to one or more control gates of every memory cell in a row. In case the control gates are made of NMOS transistors, all the memory cells are turned on when the WL connected thereto turns to a high voltage, i.e., to be activated. The BL pair is typically connected storage nodes of every memory cell in a column to a sense amplifier. The memory cell at the cross point of the activated WL and the BL pair is the one that is selected.

In a modern high density semiconductor memory, the WL may be very long, especially when the word width becomes very large. The WL has to be formed inevitably by one or more metal layers. Even so, delays caused by long WL's resistance and capacitance pose performance limitations and reliability problems in such high density semiconductor memory. Especially with the advances of process technologies which shrink down metal width and thickness, the WL's resistance becomes very significant in comparison with a drive transistor's channel resistance. For instance, for a WL being connected to 256 cells, when in a 65 nm technology, the WL resistance is about 300 ohm; but when in a nm 45 nm technology, the WL resistance is 1027 ohm. At the same time, for a driver's PMOS transistor with a channel width of 10 um, when in a 65 nm technology, the channel resistance is 259 ohm; but when in a 45 nm technology, the channel resistance is 189 ohm. As a result, the ratio between wire resistance and transistor channel resistance drastically increases when technology advances. The higher ratio increases WL slew time, which reduces effective WL pulse width and degrades read/write margin or even causes malfunctions.

FIG. 1 is a waveform diagram illustrating a word-line effective pulse width being reduced due to long slew time. CLK denotes a clock signal 102. A WL pulse 105 is freshly generated from the CLK signal. WL_RC denotes a delayed WL pulse 108 from the initial WL pulse 105 after a long wire RC delay, i.e., the WL_RC is measured at a far end of the WL away from the WL driver. Apparently, longer slew time reduces the effective WL pulse width after the long delay at WL_RC. Such problem is more acute when a process is in a fast/fast corner, meaning parameters of both NMOS and PMOS transistors are made so that such transistors have higher current and operates faster than normal. Because in the fast/fast corner, the pulse width of the initial WL 105 will be reduced. While the RC delay remains relatively constant or significantly less affected by the process variation, the WL_RC pulse width 108 will be reduced, and may eventual cause functional failure.

As such what is desired is a WL tracking scheme that can maintain a proper pulse width even at a far end of the WL.

SUMMARY

In view of the foregoing, the present invention provides a word-line tracking system for a memory array having a plurality of memory cells, the word-line tracking system comprises a dummy row having substantially identical structure as one or more regular rows of the memory cells, the dummy row including a dummy word-line having a first and second end at the opposite longitudinal ends of the dummy word-line, the first end being connected to a word-line driver, a self timing generator configured to receive a clock signal and generate a pulse signal in sync with the clock signal for the dummy word-line driver, the self timing generator having a feedback terminal for receiving a feedback signal to determine the falling edge of the pulse signal, a voltage-to-current converter connected to the second end of the dummy word-line, a current-to-voltage converter connected to the feedback terminal, and a wire connecting the voltage-to-current converter to the current-to-voltage converter.

According to one aspect of the present invention, the voltage-to-current converter comprises a PMOS transistor with one of the source and drain connected to the second end of the dummy word-line, and the other source and drain and a gate both connected to the wire.

According to another aspect of the present invention, the current-to-voltage converter comprises a PMOS transistor with a source connected to a positive voltage supply (VCC), a drain coupled to the feedback terminal of the self timing generator and a gate connected to the wire.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a word-line (WL) tracking scheme that compensates WL loading effects in accordance with the present invention.

Figure 1:
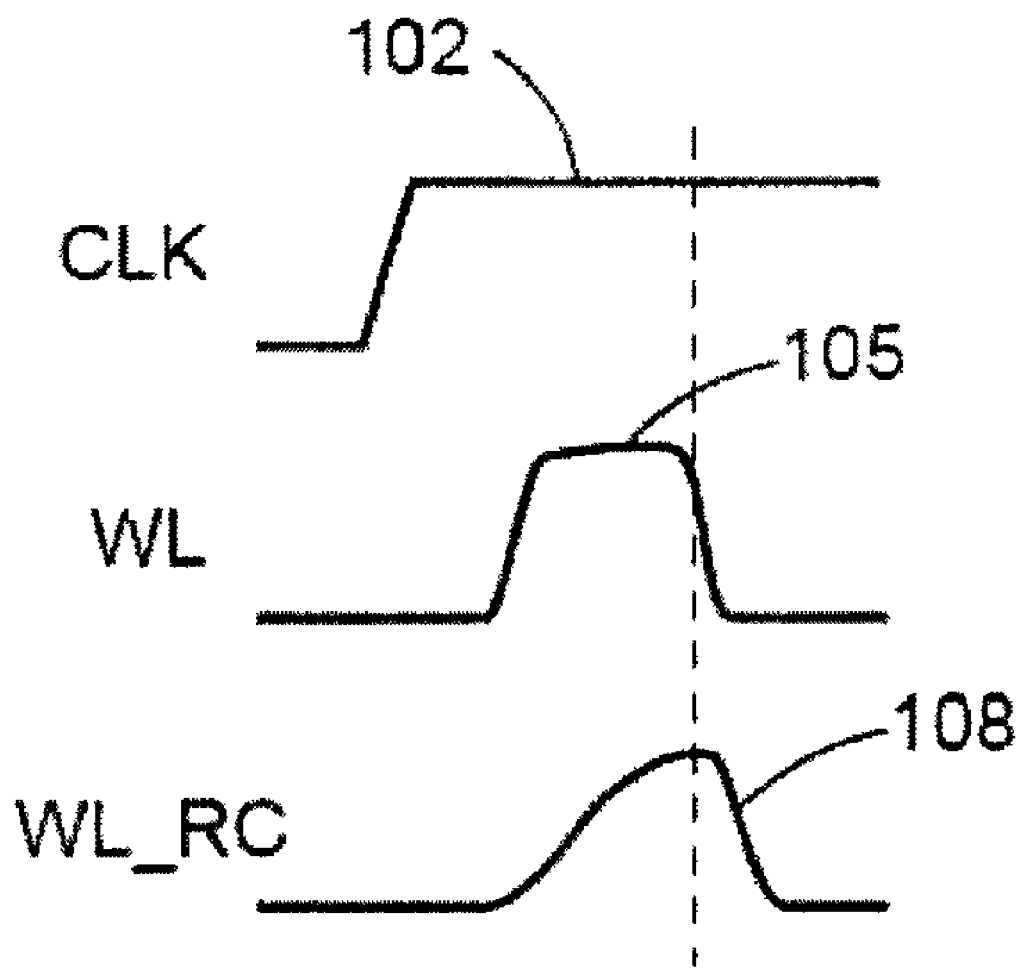
FIG. 1 is a waveform diagram illustrating a word-line effective pulse width being reduced due to long slew time.
Figure 2:
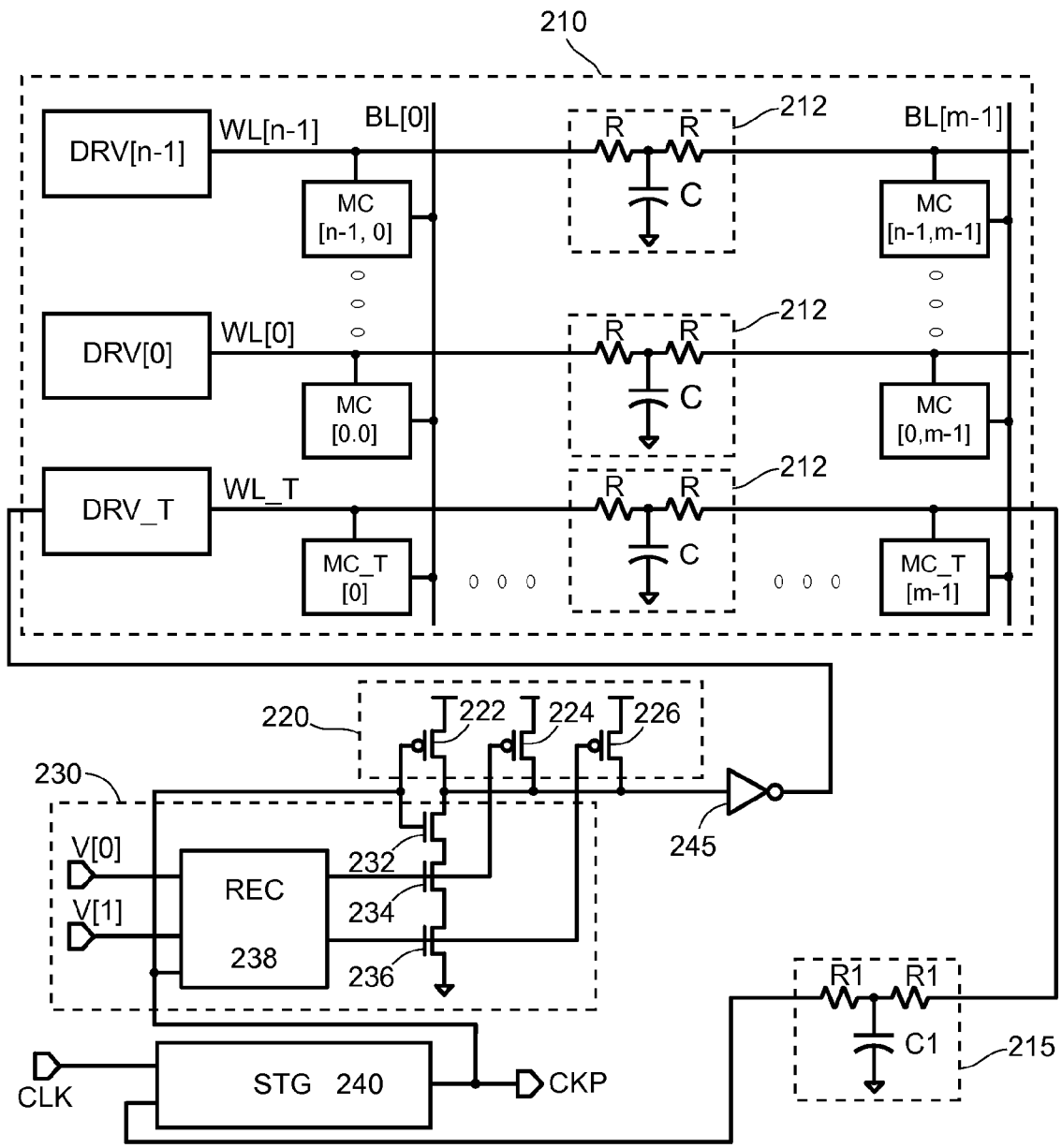
FIG. 2 is a schematic diagram illustrating a conventional word-line tracking scheme.

FIG. 2 is a schematic diagram illustrating a conventional word-line tracking scheme. A memory cell array 210 comprises an array of memory cells MC[0,0]-MC[n−1,m−1] arranged in m columns and n rows. The memory cell MC[i,j], where i=0~n−1, j=0~m−1, may be a static random access memory (SRAM) cell, a dynamic random access memory (DRAM) cell or any other kind of memory cell. A bit-line (BL) or a BL pair (not shown) is connected to every memory cell MC[i,j] in a column. A WL, being driven by a WL driver DRV[i], i=0~(n−1), is connected to every MC in a row, typically to the gate of a control gate transistor. As the memory cell array 210 may be very large, large number of transistor gates of the MC[i,0]-MC[i,m−1] as well as the long WL wire itself may pose a significant loading for the WL. Referring to FIG. 2, the loading from the memory cells MCs and the WL itself is represented by a resistor R-capacitor C circuit 212 for each WL.

In order to track the WL pulse width, a dummy row of memory cells MC_T[i] with a dummy word-line WL_T is provided. The dummy cell MC_T[i] and the dummy word-line WL_T are substantially identical to the regular memory cell MC[i, j] and regular word-line WL[i], respectively. Therefore the dummy word-line WL_T has the same loading 212. Dummy devices are devices that do not perform the function the nature of the devices call for. For instance, a dummy row of memory cell is not used to store data instead it is used to mimic the structure of the regular rows of the memory cells. Dummy devices are commonly used in integrated circuit to provide references or tracking signals.

Referring again to FIG. 2, a word-line tracking circuitry includes a self timing generator (STG) 240, a pulse-rising-edge controller 230, and a pulse-falling-edge controller 220. The self timing generator 240 takes in a system clock signal CLK as well as a word-line feedback signal, and produce a pulse signal CKP for the word-line drivers DRV[0:n−1] and DRV_T. The self timing generator 240 is well known in the art, which can generate a pulse signal CKP proportional to and in synchronize with the clock signal CLK. Typically, a rising edge of the clock signal CLK is used to generate the pulse signal CKP. The width and delay time relative to the clock signal CLK are determined by the feedback signal. In the pulse-rising-edge controller 230 a rising-edge-control module REC 238 controls two serially connected NMOS transistors 234 and 236. When both the NMOS transistors 234 and 236 are turned on in response to input signals V[0] and V[1], a rising edge will be produced at the word-line WL_T through the inverter 245 and the non-inverting word-line driver DRV_T. The pulse-falling-edge controller 220 comprises three parallel connected PMOS transistors 222, 224 and 226. Gates of the PMOS transistor 222 is controlled by the self-timing generator 240, and gates of the PMOS transistor 224, 226 are controlled by the rising-edge-control module REC 238. Any one of the PMOS transistors 222, 224, 226 being turned on will cause the word-line WL_T pulse to fall. The PMOS transistor 222 is controlled by the signal CKP, which is in turn controlled by the word-line feedback signal. Such feedback loop maintains a proper word-line pulse width even at the end of the word-line WL_T.

However, in a large memory array, the self timing generator 240 may be placed far away from the end of the WL_T, the wire that carries the feedback signal to the self-timing generator 240 may present a significant loading 215 represented by a resistor R1-capacitor C1 circuit 215 to the word-line WL_T. Therefore, the word-line tracking circuitry, in fact, compensates both the word-line loading 212 as well as the long signal line loading 215. As a result, the word-line pulse width will be larger than what is needed. On top of that, a design has to consider a process swing to a fast/fast corner. Therefore, the conventional word-line tracking scheme shown in FIG. 2 sacrifices the performance of the memory array 210.

Figure 3:
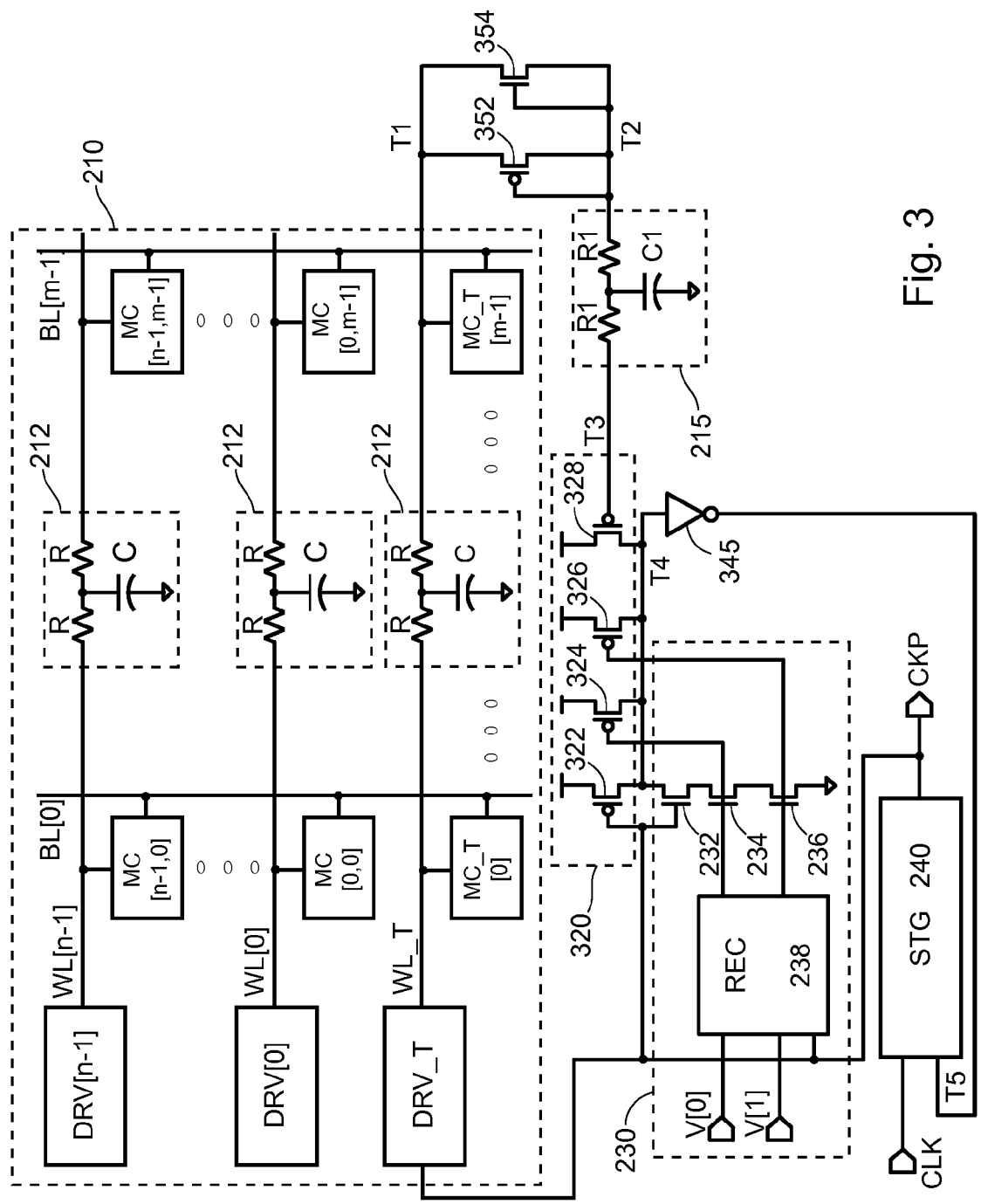
FIG. 3 is a schematic diagram illustrating a word-line tracking scheme according to one embodiment of the present invention.

FIG. 3 is a schematic diagram illustrating a word-line tracking scheme according to one embodiment of the present invention. A word-line tracking circuitry of FIG. 3 employs the same self-timing generator 240 and the pulse-rising-edge controller 230 as those in FIG. 2. But a pulse-falling-edge controller 320 in the word-line tracking circuitry of FIG. 3 has four PMOS transistors 322, 324, 326 and 328. The PMOS transistors 322, 324 and 326 work the same as the PMOS transistors 222, 224 and 226, respectively, and require no further descriptions. The PMOS transistor 328 is controlled by the word-line feedback signal at a node T3, which comes from the end of the word-line WL_T at a node T1, through transistors 352 and 354 as well as the loading 215 of the long wire connecting the transistors 352 and 354 at a node T2 to the node T3. A source of the PMOS transistor 352 is connected to the node T1. A drain and gate of the PMOS transistor 352 are connected together to the node T2. The PMOS transistor 352 is so biased that a voltage between the nodes T1 and T2 is no bigger than a threshold voltage of the PMOS transistor 352 (Vth_P). The PMOS transistor 352 with its source coupled to the node T1 and its drain and gate coupled to the node T2 constitutes a voltage-to-current converter. Similarly, a drain of the NMOS transistor 354 is connected to the node T1. A gate and a source of the NMOS transistor 354 are connected together to the node T2. The NMOS transistor 354 is so biased that a voltage between the nodes T1 and T2 is no bigger than a threshold voltage of the NMOS transistor 354 (Vth_N). Jointly the PMOS transistor 352 and the NMOS transistor 354 limit the voltage at the node T2 (V_T2) to within the voltage at the node T1 (V_T1) plus and minus the threshold voltages of the transistors 352 and 354, i.e., V_T1+Vth_N<V_T2<V_T1−Vth_P. WL_T is triggered by CKP to simulate the actual word line behavior. When CKP rises, non-inverting WL_T rises to VCC level, and the voltage at the node T2, V_T2=V_T1−Vth_P=VCC−Vth_P. V_T2 will translate the voltage swing to Node T3 and translated V_T3 to current source from 328 on the node T4. The PMOS transistor 328 with its source and drain coupled to the positive voltage supply (VCC), a feedback terminal of the self timing generator STG 240, and its gate coupled to the node T3 constitutes a current-to-voltage converter. For large word line loading instances, slew time at T1 node is large and translates the voltage swing to node T3 through the wire RC loading 215. Therefore, the slew time of T3 is large and it takes longer time to achieve the voltage level "VCC−Vth_P". As a result, the current flowing through the PMOS transistor 328 to the node T4 is supplied longer and causes the falling edge of the voltage at the node T4 to be longer. In such a way, the node T4 falling time will reflect the wire RC loading 215 and determine the falling edge of CKP.

Further, the process variation is considered to be able to reflect by the threshold voltage of 352, 354, and 328. When process is at fast corner on NMOS, the threshold voltage of the NMOS transistor 354 is lower. When WL_T is inactive, the node T1 is at 0V and the node T2 is biased at "V_T1+Vth_N=Vth_N". The PMOS transistor 328 will supplies larger current due to larger gate-source voltage since NMOS at fast corner and Vth_N is lower. When process is fast on PMOS then the current supplied by the PMOS transistor 328 is also increased due to the Vth_P of the PMOS transistor 328 is lowered. Finally, the CKP could be well tracking by simulated word-line loading and tightened process variation from Fast corner to Typical corner. The large voltage swing at the node T1 is translated to a proportional small voltage swing at the node T2 which is less affected by the wire loading 215 when propagating to the node T3. The voltage swing at the node T3 controls a conduction current of the PMOS transistor 328. The higher the conduction current the slower the voltage at a node T4 falls, which is fed back to the self-timing generator 240 through the inverter 345, hence the pulse width of the signal CKP becomes wide. In fact, the PMOS transistor 328 can also be viewed as a current amplifier. A relative small voltage swing at the gate can turn on or off the PMOS transistor 328 and produces an amplified current between the source and drain.

The voltage falling at T4 is fed back to the self-timing generator 240 for providing a proper pulse width to the word-lines. The NMOS transistor 354 serves to limit voltage swing at the node T2, so that delays by the wire loading 215 are minimized. In summary, the aforementioned voltage-to-current and the current-to-voltage conversions are to minimize delays caused by the wire loading 215, so that the feedback voltage at the node T5 is more reflective of the voltage at the node T1 which is at the end of the dummy word-line WL_T, so that the self-timing generator 240 can generate a word-line pulse more precisely to meet the need of the memory cell operation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A word-line tracking system for a memory array having a plurality of memory cells, the word-line tracking system comprising:
    a dummy row of the memory cells having substantially identical structure as one or more regular rows of the memory cells, the dummy row including a dummy word-line having a first and a second end at the opposite longitudinal ends of the dummy word-line, the first end being connected to a word-line driver;
    a self timing generator configured to receive a clock signal and generate a pulse signal in sync with the clock signal for the dummy word-line driver, the self timing generator having a first terminal for receiving a feedback signal and operative to determine a falling edge of the pulse signal;
    a voltage-to-current converter connected to the second end of the dummy word-line;
    a current-to-voltage converter connected to the first terminal; and
    a wire connecting the voltage-to-current converter to the current-to-voltage converter.

2. The word-line tracking system of claim 1, wherein the memory cells are static random access memory (SRAM) cells.

3. The word-line tracking system of claim 1, wherein the memory cells are dynamic random access memory (DRAM) cells.

4. The word-line tracking system of claim 1, wherein the voltage-to-current converter comprises a PMOS transistor with one of the source and drain connected to the second end of the dummy word-line, and the other source and drain and a gate both connected to the wire.

5. The word-line tracking system of claim 4, wherein the voltage-to-current converter further comprises a NMOS transistor with one of the source and drain connected to the second end of the dummy word-line, and the other source and drain and a gate both connected to the wire.

6. The word-line tracking system of claim 1, wherein the current-to-voltage converter comprises a PMOS transistor with a source connected to a positive voltage supply (VCC), a drain coupled to the first terminal of the self timing generator and a gate connected to the wire.

7. A word-line tracking system for a static random access memory (SRAM) cell array having a plurality of SRAM cells, the word-line tracking system comprising:
    a dummy row of the memory cells having substantially identical structure as one or more regular rows of the memory cells, the dummy row including a dummy word-line having a first and a second end at the opposite longitudinal ends of the dummy word-line, the first end being connected to a word-line driver;
    a self timing generator configured to receive a clock signal and generate a pulse signal in sync with the clock signal for the dummy word-line driver, the self timing generator having a first terminal for receiving a feedback signal and operative to determine a falling edge of the pulse signal;
    a voltage-to-current converter connected to the second end of the dummy word-line;
    a current-to-voltage converter connected to the first terminal; and
    a wire connecting the voltage-to-current converter to the current-to-voltage converter.

8. The word-line tracking system of claim 7, wherein the voltage-to-current converter comprises a PMOS transistor with one of the source and drain connected to the second end of the dummy word-line, and the other source and drain and a gate both connected to the wire.

9. The word-line tracking system of claim 8, wherein the voltage-to-current converter further comprises a NMOS transistor with one of the source and drain connected to the second end of the dummy word-line, and the other source and drain and a gate both connected to the wire.

10. The word-line tracking system of claim 7, wherein the current-to-voltage converter comprises a PMOS transistor with a source connected to a positive voltage supply (VCC), a drain coupled to the first terminal of the self timing generator and a gate connected to the wire.

11. A word-line tracking system for a dynamic random access memory (DRAM) cell array having a plurality of DRAM cells, the word-line tracking system comprising:
    a dummy row of the memory cells having substantially identical structure as one or more regular rows of the memory cells, the dummy row including a dummy word-line having a first and a second end at the opposite longitudinal ends of the dummy word-line, the first end being connected to a word-line driver;
    a self timing generator configured to receive a clock signal and generate a pulse signal in sync with the clock signal for the dummy word-line driver, the self timing generator having a first terminal for receiving a feedback signal and operative to determine a falling edge of the pulse signal;
    a voltage-to-current converter connected to the second end of the dummy word-line;
    a current-to-voltage converter connected to the first terminal; and
    a wire connecting the voltage-to-current converter to the current-to-voltage converter.

12. The word-line tracking system of claim 11, wherein the voltage-to-current converter comprises a PMOS transistor with one of the source and drain connected to the second end of the dummy word-line, and the other source and drain and a gate both connected to the wire.

13. The word-line tracking system of claim 12, wherein the voltage-to-current converter further comprises a NMOS transistor with one of the source and drain connected to the second end of the dummy word-line, and the other source and drain and a gate both connected to the wire.

14. The word-line tracking system of claim 11, wherein the current-to-voltage converter comprises a PMOS transistor with a source connected to a positive voltage supply (VCC), a drain coupled to the first terminal of the self timing generator and a gate connected to the wire.

* * * * *